United States Patent
Pfister et al.

(10) Patent No.: US 8,959,418 B1
(45) Date of Patent: Feb. 17, 2015

(54) FORWARD ERROR CORRECTION

(71) Applicant: Xilinx, Inc., San Jose, CA (US)

(72) Inventors: Henry D. Pfister, Bryan, TX (US); Krishna R. Narayanan, College Station, TX (US); Raied N. Mazahreh, Sandy, UT (US); Raghavendar M. Rao, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 126 days.

(21) Appl. No.: 13/691,501

(22) Filed: Nov. 30, 2012

(51) Int. Cl.
*H03M 13/00* (2006.01)
*H03M 13/05* (2006.01)

(52) U.S. Cl.
CPC .................................. *H03M 13/05* (2013.01)
USPC .......................................... 714/785; 714/746

(58) Field of Classification Search
CPC ............................ H03M 13/151; H03M 13/15
USPC ................... 714/785, 746, 782, 784
See application file for complete search history.

(56) References Cited

U.S. PATENT DOCUMENTS

| | | | | |
|---|---|---|---|---|
| 5,712,867 | A * | 1/1998 | Yokev et al. | 375/136 |
| 7,509,564 | B2 * | 3/2009 | Dohmen et al. | 714/782 |
| 8,458,575 | B2 * | 6/2013 | Dohmen et al. | 714/782 |

OTHER PUBLICATIONS

Jain, Yung-Yih. et al., "Iterative Hard-Decision Decoding of Braided BCH Codes for High-Speed Optical Communication", pp. 1-6, Dec. 9-13, 2013, IEEE GLOBECOM 2013,Global Communications Conference, Exhibition & Industry Forum, Atlanta, GA, USA.
Feltstrom, A.J., et al., "Braided Block Codes," IEEE Transactions on Information Theory, vol. 55, Issue 6, pp. 2640-2658, Jun. 2009.
Jian, Yung-Yih, et al., "Approaching Capacity at High Rates with Iterative Hard-Decision Decoding", Information Theory Proceedings (ISIT), 2012 IEEE International Symposium on, pp. 2696-2700, Jul. 1-6, 2012, Dept. of Electrical & Computer Engineering, College Station, TX US.
Lentmaier, M. et al., "Density evolution analysis of Protograph-based braided block codes on the erasure channel," In Proc. $8^{th}$ Intern. ITG Conf. on Source and Channel Coding (SCC), pp. 1-6, Feb. 2010, Siegen, Germany.

* cited by examiner

*Primary Examiner* — Fritz Alphonse
(74) *Attorney, Agent, or Firm* — LeRoy D. Maunu

(57) ABSTRACT

In one embodiment, a circuit for FEC decoding includes first and second syndrome calculation circuits, configured to calculate FEC syndromes for rows and columns of symbols in a de-interleaved format, respectively. A decoding circuit is configured to arrange the symbols into windows. Each window includes a plurality of sequential rows and sequential columns of the symbols in the de-interleaved format. The decoding circuit is configured to place N of the windows in a group and perform M decoding iterations of the windows in the group. In each decoding iteration, the decoding circuit performs FEC decoding of rows of each of the windows in the group followed by FEC decoding of columns of each of the windows in the group.

20 Claims, 14 Drawing Sheets

FORWARD ERROR CORRECTION

FIELD OF THE INVENTION

The disclosure generally relates to forward error correction.

BACKGROUND

Forward error correction plays a critical role in high bit rate communications. Forward error correction (FEC) is often used to detect and correct symbols of a data packet received in error without requiring retransmission. FEC coding adds redundancy to a message by encoding such a message prior to transmission. For FEC, some example error correction codes include Hamming, Bose-Chaudhuri-Hochquenghem (BCH), Reed-Solomon (RS), Viterbi, trellis, etc.

SUMMARY

In one embodiment, a circuit for FEC decoding is provided. The circuit includes a first syndrome calculation circuit that is configured to calculate a first set of FEC syndromes for rows of received symbols in a de-interleaved format. A second syndrome calculation circuit is configured to calculate a second set of FEC syndromes for columns of received symbols in a de-interleaved format. A decoding circuit is configured to arrange the symbols into windows, each window including a plurality of sequential rows and a plurality of sequential columns of the symbols in the de-interleaved format. The decoding circuit is further configured to place N of the windows in a group and perform M decoding iterations of the windows in the group. In each decoding iteration, the decoding circuit performs FEC decoding of rows of each of the windows in the group using the first set of FEC syndromes. Following the FEC decoding of rows in each decoding iteration, the decoding circuit performs FEC decoding of columns of each of the windows in the group using the second set of FEC syndromes.

In another embodiment, a method for FEC decoding is provided. A first plurality of data symbols are received in an interleaved format. A first set of FEC syndromes are determined for respective groups of the data symbols corresponding to respective rows of the symbols in a de-interleaved format. A second set of FEC syndromes are determined for respective groups of the data symbols corresponding to respective columns of the symbols in the de-interleaved format. Windows of the data symbols are decoded using the first and second sets of FEC syndromes. Each window includes a plurality of sequential rows of the data symbols in the de-interleaved format and a plurality of sequential columns of the data symbols in the de-interleaved format. The FEC decoding of the windows of the data symbols includes placing N of the windows in a group and performing M decoding iterations of the windows in the group. In each decoding iteration FEC decoding is performed on rows of each window in the group. After the FEC decoding of rows, FEC decoding is performed on columns of each window in the group.

In yet another embodiment, a method for FEC decoding is provided. A data block of symbols are received in an interleaved format. The rate of the data block of symbols is adjusted and a plurality of symbols including zero padding bits are added to the data block of symbols in the interleaved format. A first set of FEC syndromes are determined for respective groups of the symbols corresponding to respective rows of the symbols in a de-interleaved format. A second set of FEC syndromes are determined for respective groups of the symbols corresponding to respective columns of the symbols in the de-interleaved format. Windows of the data symbols are decoded using the first and second sets of FEC syndromes. Each window includes a plurality of sequential rows of the data symbols in the de-interleaved format and a plurality of sequential columns of the data symbols in the de-interleaved format. The FEC decoding of the windows of the data symbols includes placing N of the windows in a group and performing M decoding iterations of the windows in the group. In each decoding iteration FEC decoding is performed on rows of each window in the group. After the FEC decoding of rows, FEC decoding is performed on columns of each window in the group.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Methods and circuits are disclosed for FEC encoding and decoding using braided FEC codes. Braided FEC codes arrange data symbols into a diagonal two-dimensional array that may be extended indefinitely. Rows and columns of the diagonal array are each encoded to produce respective sets of parity bit information that may be used to recover data symbols that are lost or become corrupted in transmission. Data symbols are typically transmitted in a rectangular matrix format. Due to the unique shape of the diagonal two-dimensional arrays used by the braided FEC codes, symbols are interleaved and de-interleaved during the encoding, transmission, and decoding processes. In the following discussion, FEC coding and decoding is performed in a manner that efficiently interleaves and de-interleaves data symbols in the encoding and decoding processes.

In some of the disclosed methods and circuits, FEC decoding of braided FEC coded data is performed using a windowed decoding. In the windowed decoding, multiple rows and columns of the symbols, received in an interleaved format, are reformatted to acquire rows and columns of the symbols in a de-interleaved format. The interleaved and de-interleaved formats are described in more detail with reference to FIGS. 1-7. The rows and columns of the symbols in the de-interleaved format are grouped into windows. In each decoding iteration, rows included in several selected windows are decoded prior to decoding of columns included in the selected windows or vice-versa.

Initially, a number of the windows N (N≥2) are placed into the group and decoded for a number of iterations M (M≥1). In each decoding iteration, FEC decoding is first performed on each row of the windows in the group. Afterward, FEC decoding is performed on each column of the windows in the group. After the first M decoding iterations, one of the windows at the end of the group is removed, a new window is added to the beginning of group, and M decoding iterations are performed on the windows in the group and so on.

Figure 1:
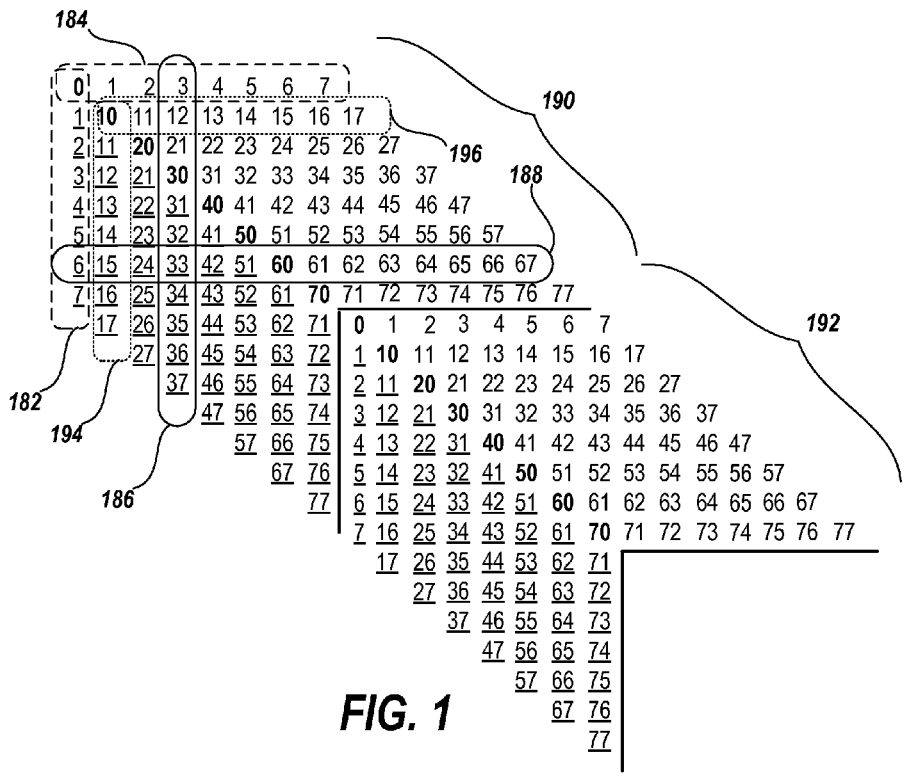
FIG. 1 shows a matrix of data symbols for braided forward error correction codes.

FIG. 1 shows a matrix of data symbols for an FEC braided block code. A braided block code arranges data symbols into a diagonal two-dimensional array that may be extended indefinitely. Data symbols are arranged into respective pairs of overlapping vertical and horizontal symbol segments (e.g., symbol segment pair 182 and 184 and segment pair 194 and 196), where a topmost symbol of the vertical segment is also included in the corresponding horizontal symbol segment. In this example, symbols in the vertical symbol segments are underlined, and symbols shared between vertical and horizontal segments are shown as bold numerals. The segment pairs are arranged diagonally. Segment pairs are diagonally appended to form the diagonal matrix. For instance, the segment pair 194 and 196 is located diagonally below and to the right of the segment pair, which includes segments 182 and 184, having shared symbol 0. The diagonal matrix may be extended indefinitely to include multiple data blocks. For instance, in the example shown in FIG. 1, the diagonal matrix is extended to include two data blocks 190 and 192. For ease of reference, the diagonal matrix arrangement may be referred to as a de-interleaved format.

For each row and column (e.g., row 188 and column 186) of the de-interleaved format, a respective set of parity bits is generated that may be used to detect and/or recover from errors in the respective row or column. In the de-interleaved format, each data symbol is separately encoded in one row and one column. For example, a first set of parity bits is determined for column 186 and a second set of parity bits is generated for row 188. Respective sets of parity bits are also generated for each of the other rows and columns in the de-interleaved format. For ease of reference, the parity bits generated for a respective row or column may be referred to as an FEC datagram. FEC datagrams may be calculated for each row and column of symbols in the de-interleaved format using a number of coding algorithms including, for example, Hamming, RS, BCH, Viterbi, Trellis, XOR, etc. For ease of reference, examples are primarily described as having datagrams generated using BCH encoding. However, the examples may be modified to alternatively or additionally utilize other coding algorithms as well.

In performing FEC decoding of a block of data symbols after transmission, one or more symbols in a row or column may be corrected using a corresponding FEC datagram. The maximum number of symbols that may be corrected in a row or column depends on the coding algorithm used and the number of parity bits included in each FEC datagram. If a row includes more symbols in error than the maximum number of data symbols that can be corrected, correction cannot be performed using the corresponding row FEC datagram. However, even if a row contains more symbols in error than the maximum, some of the data symbols in error may be recovered in their columns using the column FEC datagrams. After recovering the one or more symbols using the column FEC datagrams, the number of data symbols in error in the row may be less than the maximum number. If so, the remaining data symbols in error in the row may be corrected using the corresponding row FEC datagram. By iteratively alternating between FEC decoding rows and FEC decoding columns, a larger number of missing data symbols may be recovered.

Figure 2:
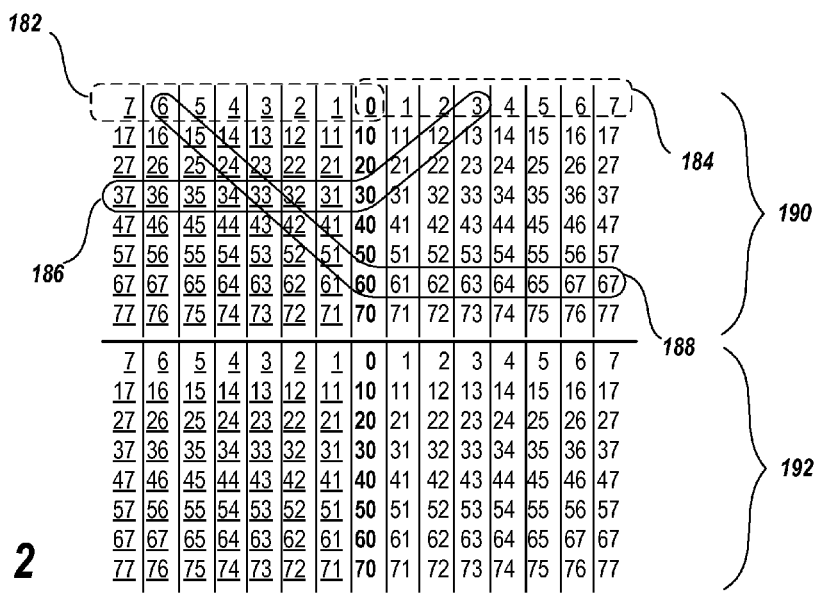
FIG. 2 shows the matrix of data symbols of FIG. 1 arranged in an interleaved format.

To facilitate transmission, columns of the symbols in the de-interleaved format may be shifted to arrange the symbols into a rectangular matrix used by most transport protocols. This shifting causes portions of the rows and columns of the data block in the de-interleaved format to become interleaved. For ease of reference, the rectangular matrix rearrangement of symbols from a de-interleaved data block (e.g., FIG. 1) may be referred to as an interleaved format. FIG. 2 shows the matrix of data symbols of FIG. 1 rearranged into an interleaved format. In the interleaved format, segments of each segment pair of the data blocks in the de-interleaved format shown in FIG. 1 are aligned in a respective row of the rectangular matrix. For instance, segments of the segment pair having vertical and horizontal segments 182 and 184 are aligned in the first row of the interleaved format shown in FIG. 2. In this alignment, rows and columns of the de-interleaved format (e.g., 188 and 186) become interleaved. For instance, symbols of column 186 of the braided FEC format are aligned in the fourth row in the left half of the interleaved format, but are interleaved in different rows (i.e., rows 1-3) in the right half of the interleaved format. Conversely, symbols of row 188 of the de-interleaved format are aligned in the seventh row in the right half of the interleaved format, but are interleaved in different rows (i.e., rows 1-6) in the left half of the interleaved format.

For ease of explanation, the examples are primarily described with reference to transmission of the symbols in the interleaved format shown in FIG. 2. However, it is understood that symbols may be transmitted in other formats as well, in which rows of the de-interleaved format are interleaved with columns of the de-interleaved format.

In the data blocks 190 and 192 shown in FIGS. 1 and 2, each of the vertical and horizontal segments (e.g., 182 and 184) include seven symbols in addition to the shared symbol of the pair. As a result, the data block in the de-interleaved format and the interleaved format includes 15 columns (7*2+1). However, the embodiments are not so limited. Rather, the size of vertical and horizontal segments may be increased or decreased as required for different applications. For instance, for BCH (1023, 991) coding (1023 bit codewords having 991 data bits and 32 parity bits), a data block may be arranged into 3-bit symbols with 170 symbols in each of the vertical and horizontal segments in addition to the shared symbol ((170*2+1)*3=1023). For ease of illustration and explanation, interleaving and de-interleaving of the braided FEC data is primarily described with reference to one of the data blocks (e.g., 190) in the 15-column example shown in FIGS. 1 and 2.

In many communication systems, a receiver is generally configured to receive data in rectangular matrices, either one row or one column at a time. For ease of reference, the examples and embodiments are primarily described with reference to a communication system that receives data in the rectangular interleaved format one row at a time. Due to the interleaving of the rows and columns of the de-interleaved format when rearranged into the interleaved format described above, rows and/or columns must be de-interleaved before FEC decoding can be performed using the parity bits to detect and/or correct errors in each row or column. Similarly, when encoding data to produce braided FEC coded data in the de-interleaved format (e.g., FIG. 1), data symbols to be encoded are generally received in a rectangular format, such as that shown in FIG. 2. The input rectangular data block must be rearranged to align rows and columns of the symbols of the de-interleaved format before FEC may be performed to determine parity bits for each row or column.

In the following discussion, various methods and systems are described for FEC coding and decoding, that efficiently convert data symbols between the interleaved format and other formats that align rows and columns of the de-interleaved format for FEC encoding or decoding. Rows and columns of the de-interleaved format are interleaved and de-interleaved by shifting columns of the symbols. For instance, in one application, an FEC decoder is configured to alternate between arranging data symbols (received in the interleaved format) between a row-aligned format and a column-aligned format for FEC decoding of rows and columns of the de-interleaved format. In the row-aligned format, the symbols are arranged such that symbols in each row correspond to a respective row of symbols in the de-interleaved format. When in the row-aligned format, rows of the row-aligned format (i.e., rows of the de-interleaved format) may be input to a first FEC decoder one at a time for performing FEC on rows of symbols in the de-interleaved format. In the column-aligned format, the symbols are arranged such that symbols in each row of symbols in the column aligned format correspond to a respective column of symbols in the de-interleaved format. When in the column-aligned format, rows of the column-aligned format (i.e., columns of the de-interleaved format) may be input to a second FEC decoder one at a time for performing FEC on columns of symbols in the de-interleaved format.

Figure 3:
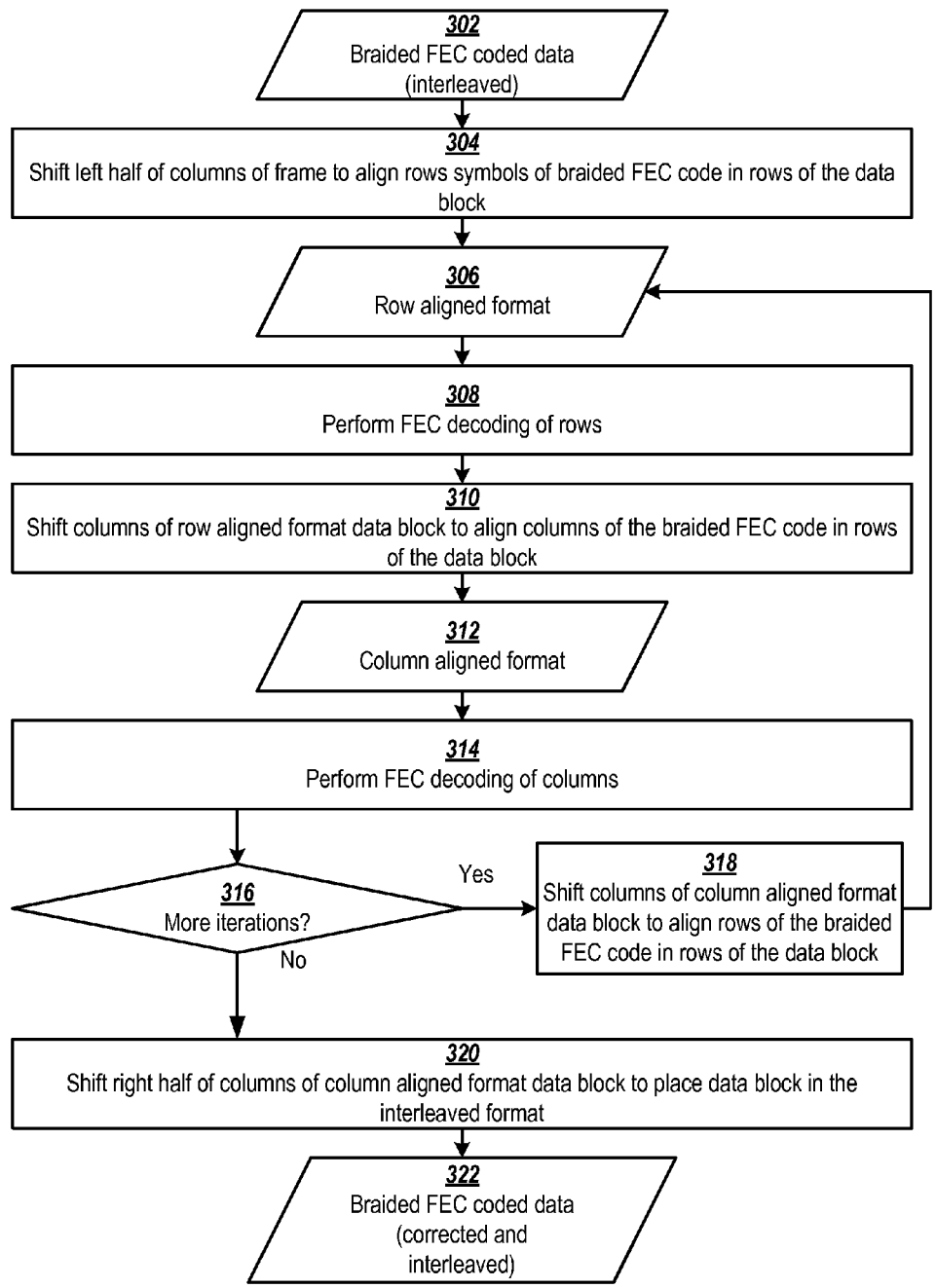
FIG. 3 shows a method for performing FEC decoding of a data block encoded with a braided FEC code.

FIG. 3 shows a method for performing FEC decoding of a data block that is encoded with a braided FEC code. A frame of data 302, encoded with a braided FEC code, is received in the interleaved format. The left half of the columns in the frame are shifted at block 304 to align symbols into the row-aligned format 306. In the row-aligned format, rows of the symbols from the de-interleaved format are aligned in respective rows. Rows of the braided FEC format are FEC decoded using corresponding FEC datagrams at block 308. After FEC decoding of the rows, columns of the row-aligned format 306 are shifted at block 310 to rearrange symbols into the column-aligned format 312. In the column-aligned format 312, columns of symbols in the de-interleaved format are aligned in respective rows. Columns of the de-interleaved format are FEC decoded using corresponding FEC datagrams at block 314.

As described above, multiple iterations of row and column decoding may be performed to correct a larger number of data symbols in error. If more iterations are to be performed, decision block 316 directs the process to block 318, where columns of the column-aligned format 312 are shifted to rearrange symbols into the row-aligned format 306. Row decoding, shifting of rows/columns, and column decoding are then repeated as described above with reference to blocks 308, 310, 312 and 314. If no more decoding iterations are to be performed, the right half of the columns of the column-aligned format 312 are shifted at block 320 to rearrange the corrected symbols back into the interleaved format 322.

Figure 4:
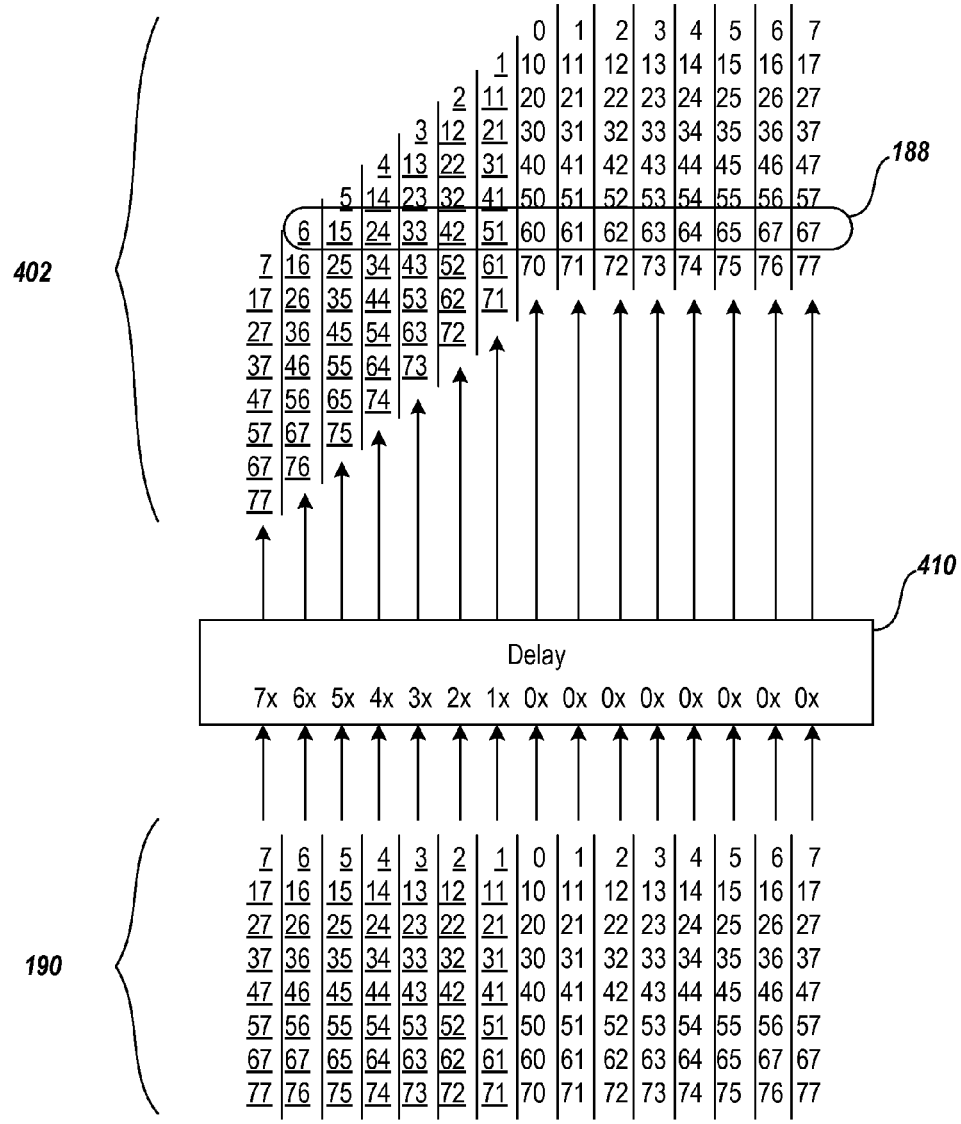
FIG. 4 illustrates shifting columns of data symbols in an interleaved data format to place the data symbols in a row-aligned format.

FIG. 4 illustrates shifting columns of symbols from an interleaved format into a row-aligned format. In this example, the symbols of data block 190 in the interleaved format shown in FIG. 2 are rearranged to place the symbols into the row-aligned format 402. As described with reference to block 304 in FIG. 3, the left half of the columns in the interleaved format 190 are shifted to arrange the symbols into the row-aligned format 402. For instance, the symbols from the interleaved format that comprise row 188 of the de-interleaved format shown in FIG. 1, are aligned in the seventh row of the row-aligned format 402.

As indicated above, the rows of symbols of the interleaved format are received one at a time with symbols of each row of the interleaved format being received in parallel. For instance, the top row of the symbols in the interleaved format 190 may be received in parallel at time t0 and the second row may be received in parallel at time t1. In this example, columns are shifted by delaying symbols, corresponding to different columns, by different amounts of delay as rows are received. A delay circuit 410 delays symbols of the different columns. In this 15-column example, the leftmost seven columns are delayed by units of delay 7x, 6x, 5x, 4x, 3x, 2x, and 1x, respectively (x connotes a unit of delay equal to the number of bits in 1 symbol). The rightmost seven columns and the center column are not delayed (0x units of delay). In general, for a block of symbols in the interleaved format having L columns, the (L−1)/2 leftmost columns are each delayed by a respective number of delay units equal to a difference between an index of the column and an index of the center column (L+1)/2. As a result of the delays, the columns are shifted to place the symbols into the row-aligned format 402.

Figure 5:
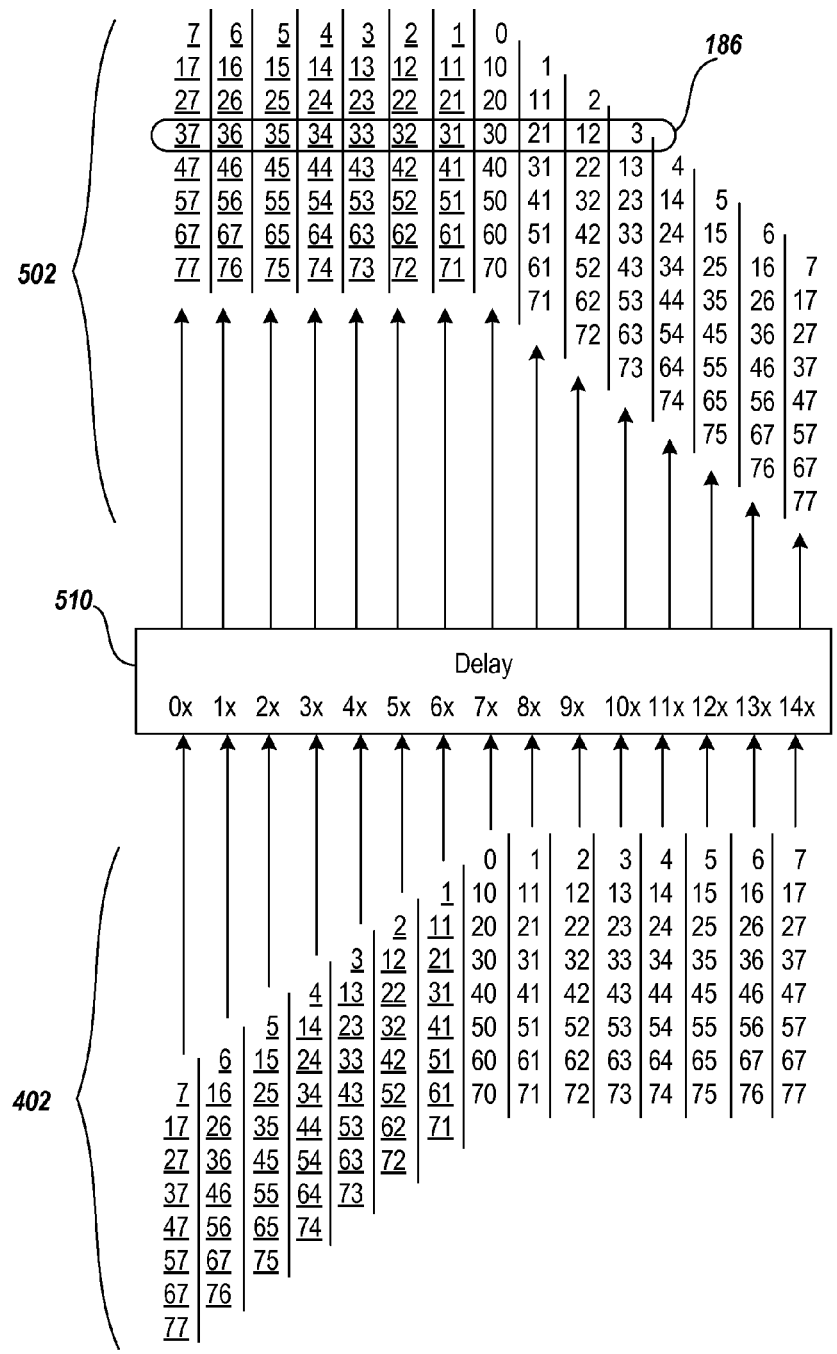
FIG. 5 illustrates shifting columns of data symbols in the row-aligned format to place the data symbols in a column-aligned format.

FIG. 5 illustrates shifting columns of symbols in the row-aligned format to place the symbols into a column-aligned format. In this example, the symbols in the row-aligned format 402 shown in FIG. 4 are rearranged to place the symbols into the column-aligned format 502. As described with reference to block 310 in FIG. 3, the columns of the symbols in the row-aligned format 402 are shifted to arrange the symbols into the row-aligned format 502. For instance, symbols of column 186 in the de-interleaved format shown in FIG. 1 are aligned in the fourth row of the column-aligned format 502.

As described with reference to FIG. 4, columns are shifted by delaying symbols, corresponding to different columns by different amounts of delay as rows of the row-aligned format 402 are received. A delay circuit 510 delays symbols of the different columns. In this 15-column example, the columns are delayed by respective numbers of delay units 0x through 14x from the leftmost column to the rightmost column. In general, for a block of symbols in the interleaved format having L columns, each column is delayed by a respective number of delay units equal to an index of the column (0 to L−1 from the leftmost column to the rightmost). As a result of the delays, the columns are shifted to place the symbols into the column-aligned format 502.

Figure 6:
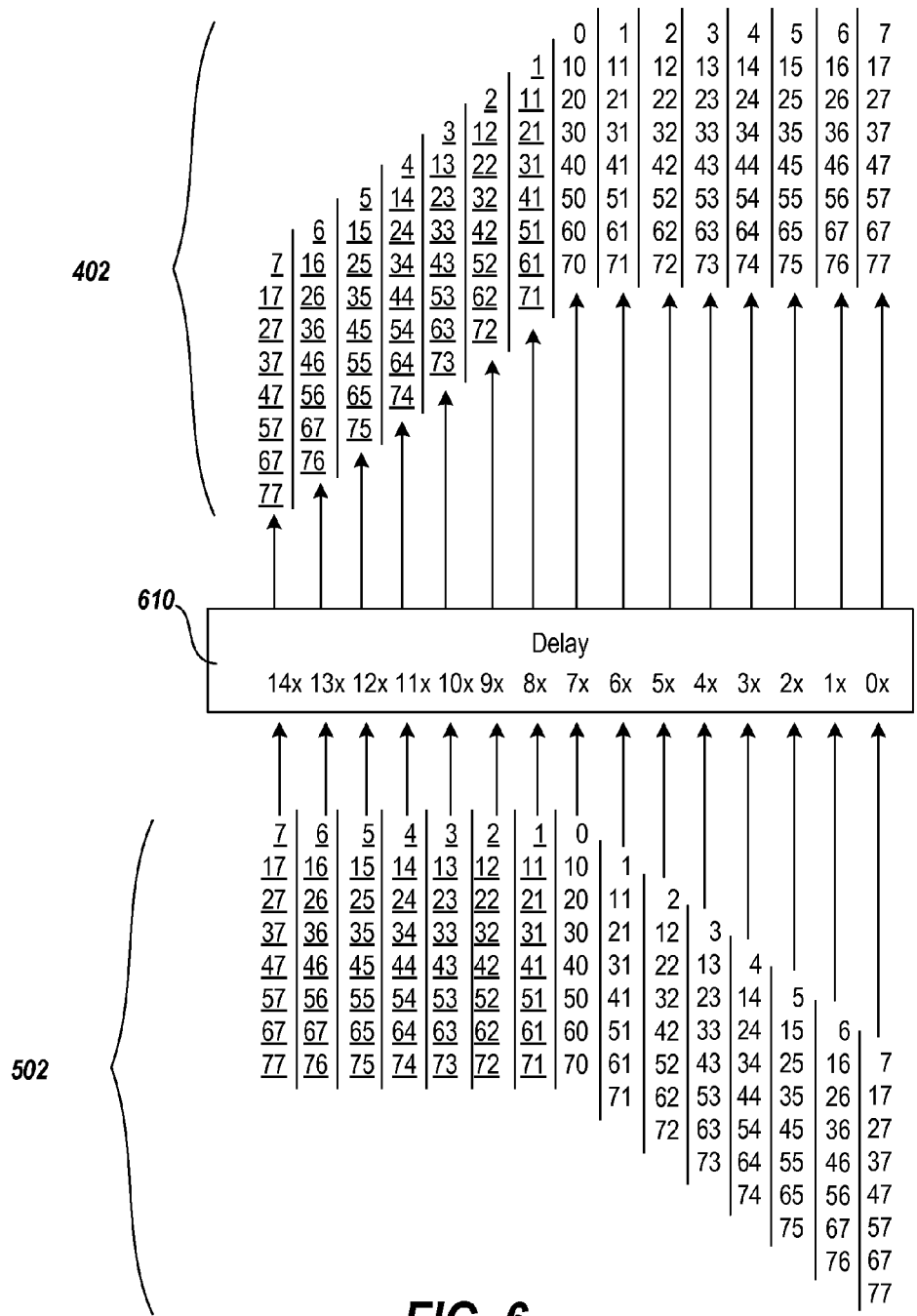
FIG. 6 illustrates shifting columns of data symbols in the column-aligned format to place the data symbols in the row-aligned format.

FIG. 6 illustrates shifting columns of symbols in the column-aligned format to place the symbols in the row-aligned format. In this example, the symbols in the column-aligned format 502 shown in FIG. 5 are rearranged to place the symbols back into the row-aligned format 402 shown in FIG. 4. As described with reference to block 318 in FIG. 3, the columns of the symbols in the column-aligned format 502 are shifted to arrange the symbols into the row-aligned format 402.

As described above, columns are shifted by delaying symbols, corresponding to different columns by different amounts of delay as rows of the column-aligned format 502 are received. A delay circuit 610 delays symbols of the different columns. In this 15-column example, the columns are delayed by respective numbers of delay units 14x through 0x (from the leftmost column to the rightmost column). In general, for a block of symbols in the interleaved format having L columns, each column is delayed by a respective number of delay units equal to (L−1)−M, wherein M is an index of the column (0 to L−1, from the leftmost column to the rightmost). As a result of the delays, the columns are shifted to place the symbols back into the row-aligned format 502.

Figure 7:
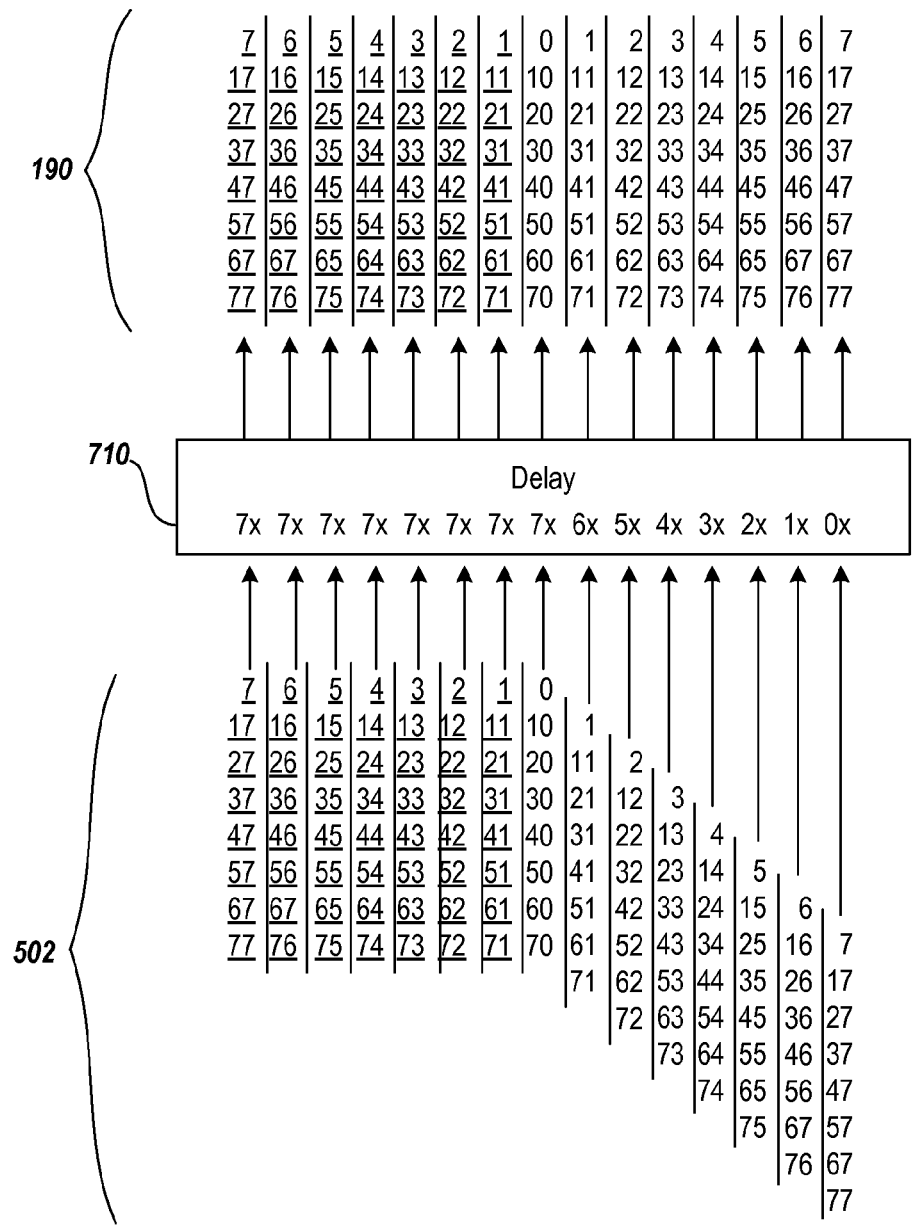
FIG. 7 illustrates shifting columns of data symbols in the column-aligned format to place the data symbols in the interleaved format.

FIG. 7 illustrates shifting columns of symbols in the column-aligned format to place the symbols in the interleaved format. In this example, the symbols in the column-aligned format 502 shown in FIG. 5 are rearranged to place the symbols back into the interleaved format 190 shown in FIG. 4. As described with reference to block 320 in FIG. 3, the columns of the symbols in the column-aligned format 502 are shifted to arrange the symbols into the interleaved format 190.

As described above, columns are shifted by delaying symbols, corresponding to different columns by different amounts of delay as rows of the column-aligned format 502 are received. A delay circuit 710 delays symbols of the different columns. In this 15 column example, the leftmost eight columns are each delayed by 7x delay units. The rightmost seven columns are delayed by respective delay amounts 6x, 5x, 4x, 3x, 2x, 1x, and 0x. In general, for a block of symbols in the interleaved format having L columns, the (L+1)/2 leftmost columns are each delayed by (L−1)/2 delay units. The (L−1)/2 rightmost columns are each delayed by a respective number of delay units equal to L−M, where M is the index of the column. As a result of the delays, the columns are shifted to place the symbols back into the interleaved format 190.

As indicated above, in some applications, decoding of rows and columns of symbols of the de-interleaved format may be repeated—alternating between decoding rows of symbols of the de-interleaved format and decoding columns of symbols of the de-interleaved format by placing the symbols into the row-aligned and column-aligned formats. In some implementations, FEC decoding may be performed in a pipeline, with each stage in the pipeline performing one iteration of row decoding and column decoding. For ease of explanation, examples are primarily described with reference to decoding stages or iterations in which row decoding is performed followed by column decoding. However, the embodiments are not so limited. Rather, references to rows and columns may be interchanged. For instance, operations described as being performed on rows may alternatively be performed on columns with operations described as being performed on columns being performed on rows.

Braided codes, such as that discussed above, are designed to facilitate streaming decoding where rows and columns of the symbols in the de-interleaved format are individually decoded in the order they are received by a decoder. However, streaming decoding generally requires decoding of each row and column to be repeated several times in order to correct all errors. For example, as indicated above, a row may include more symbols in error than the maximum number of data symbols that can be corrected. As a result, the errors of the row cannot be corrected using the corresponding row FEC datagram until some of the errors are corrected by the decoding of columns. In the streaming decoding method, the first rows and columns that are decoded are less likely to be correctable than rows and columns that are subsequently decoded because fewer symbols have been corrected. Additional decoding iterations are likely required to correct symbols in these rows and columns. As a result, latency of streaming decoders tends to be quite high in order to perform the number of decoding iterations required to achieve a suitable coding gain.

In some of the disclosed embodiments, the decoding iterations of the rows and columns are performed using a windowed decoding. In the windowed decoding, multiple rows and columns of the symbols in the de-interleaved format are grouped into windows. In each decoding iteration, rows included in several selected windows are decoded prior to decoding of columns included in the selected windows or vice-versa. Using this approach, latency may be reduced by decoding multiple windows in parallel.

Figure 8A:
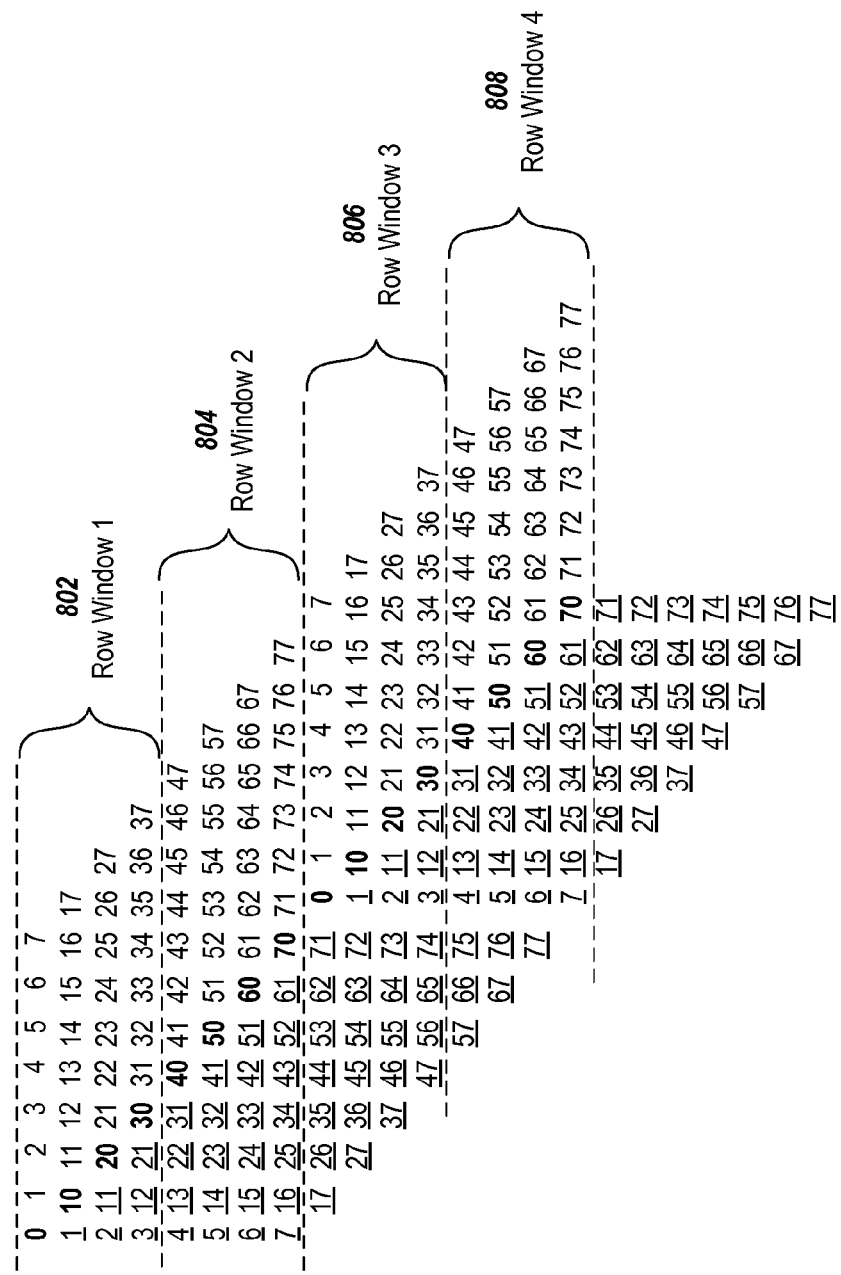
FIGS. 8*a* and 8*b* show rows and columns of a matrix of data symbols shown in FIG. 1 grouped into windows.
Figure 8B:
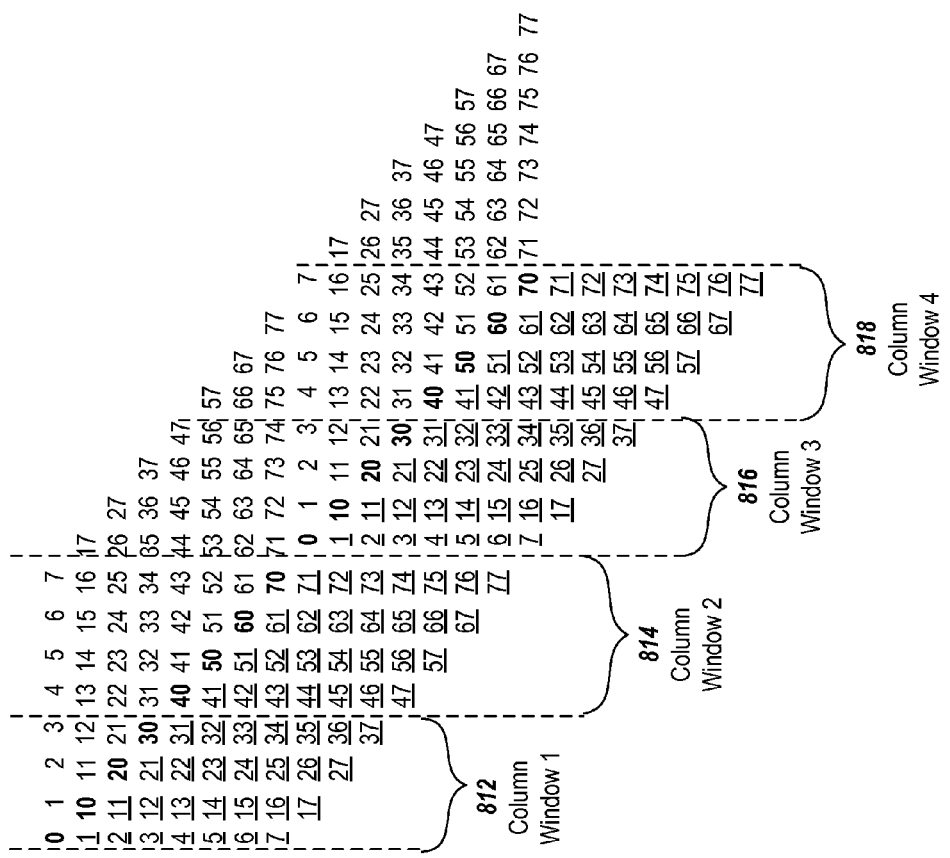

FIGS. 8A and 8B show rows and columns of symbols in the de-interleaved format grouped into windows. In this example, rows and columns of the symbols shown in FIG. 1 are grouped into four windows. Window 1 includes rows 1-4 of the symbols 802 shown in FIG. 8A and columns 1-4 of the symbols 812 shown in FIG. 8B. Window 2 includes rows 5-8 of the symbols 804 shown in FIG. 8A and columns 5-8 of the symbols 814 shown in FIG. 8B. Window 3 includes rows 9-12 of the symbols 806 shown in FIG. 8A and columns 9-12 of the symbols 816 shown in FIG. 8B. Window 4 includes rows 13-16 of the symbols 808 shown in FIG. 8A and columns 13-16 of the symbols 818 shown in FIG. 8B.

In some implementations, the rows and columns are decoded in a group of windows. A number of the windows N (N≥2) are placed into the group and decoded for a number of iterations M (M≥1). For ease of explanation, the group is described as a list of windows, with new windows added to the front of the list and old windows removed from the end of the list. The grouping of windows may be implemented using a first-in-first-out (FIFO) memory buffer or various data structures, such as, a linked list, memory array, etc. In each decoding iteration, FEC decoding is first performed on each row of the windows in the group. Afterward, FEC decoding is performed on each column of the windows in the group. After the first M decoding iterations, one of the windows at the end of the group is removed, a new window is added to the beginning of group, and M decoding iterations are performed on the windows in the group. This process is repeated every M decoding iterations as new windows are received.

As one example, Table 1 illustrates four iterations of windowed decoding using a group of N=2 windows. However, decoding may be implemented to process groups including other numbers of windows. In the first M decoding iterations, window 1 and window 2 are each decoded for M decoding iterations. After the first M iterations, window 1 is removed from the group, and new window 3 is added to the group. In the second M iterations, windows 2 and 3 are each decoded for M iterations. After the second M iterations, window 2 is removed from the group and new window 4 is added to the group. In the third M iterations, windows 3 and 4 are each decoded for M iterations. After the third M iterations, window 3 is removed from the process group and new window 5 is added, and in the fourth M iterations windows 4 and 5 are decoded for M iterations. This process is repeated for additional iterations, as new windows are received.

TABLE 1

| Iterations | Windows In Group |
|---|---|
| 1$^{st}$ M iterations | Window 1, Window 2 |
| 2$^{nd}$ M iterations | Window 2, Window 3 |
| 3$^{rd}$ M iterations | Window 3, Window 4 |
| 4$^{th}$ M iterations | Window 4 Window 5 |

Figure 9:
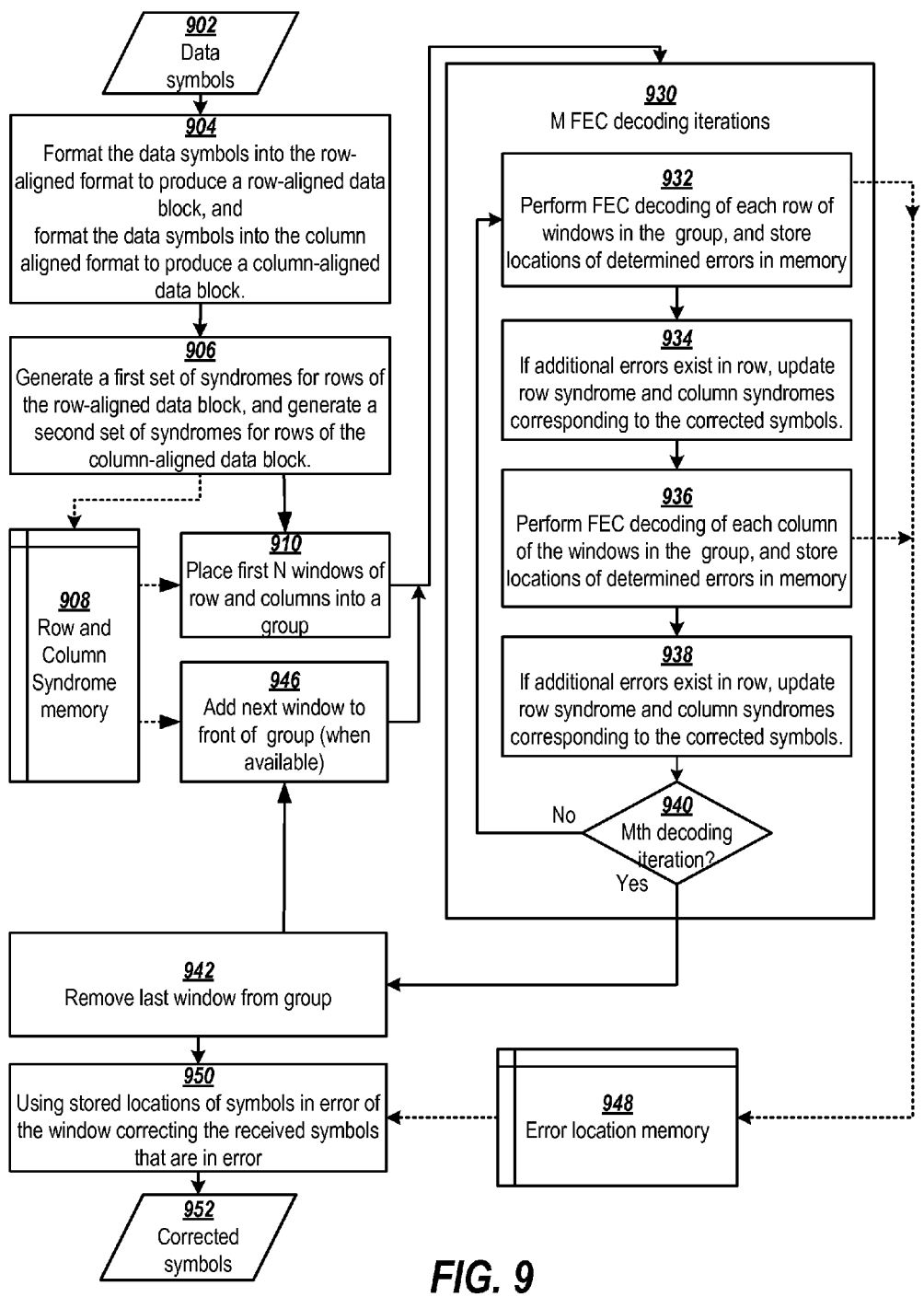
FIG. 9 shows a flowchart of a process for performing windows FEC decoding in accordance with one or more embodiments.

FIG. 9 shows a flowchart of a process for performing FEC decoding of rows and columns in groups of windows. In this example, flow of the processes is shown with solid directional lines. Dataflow to and from memory units (e.g., 908 and 948) are shown with dashed directional lines. Data symbols 902 are received in the interleaved format. The received data symbols are formatted into the row-aligned format to produce a row-aligned block of the data symbols at block 904. The received data symbols are also formatted into the column-aligned format to produce a column-aligned data block at block 904. A first set of syndromes is generated for rows of the row-aligned data block at block 906. A second set of syndromes is also generated for rows of the column-aligned data block at block 906. The syndromes generated at block 906 are stored in row and column syndrome memory 908.

The first N windows of rows and columns are placed into a group at block 910. The windows of the group are decoded for M decoding iterations at block 930. As described above, in each decoding iteration, FEC decoding is performed on each row of the windows in the group at block 932 and determined locations of errors are stored in an error location memory 948. If additional errors exist in a row following a decoding iteration, the corresponding row syndrome and column syndromes affected by the row are updated at block 934. FEC decoding is performed on each column of the windows in the group at block 936 and determined locations of symbols in error are stored in the error location memory 948. If additional errors exist in a column following the decoding iteration, the corresponding column syndrome and row syndromes affected by the column are updated at block 938.

After the M decoding iterations have completed, as indicated by decision block 940, a window at the end of the group is removed at block 942. As a window has been removed, there is room to add another window to the group. A new window is added to the front of the group (when available) at block 946, and M decoding iterations are performed on the windows of the group at block 930 as described above. This process is repeated, removing a window from the end of the group and adding a new window to the front of the group (when available) every M decoding iterations.

When a window is removed from the group at block 942, bits of the removed window that are in error are corrected at block 950. The correction of errors is performed according to the stored locations of the errors determined in the previous decoding iterations, to produce corrected symbols 952.

In some implementations, in response to detecting decoding failure, the windowed decoder resets one or more of the updated syndromes in the first and second set of FEC syndromes corresponding to rows and columns of the window that subject to the decoding failure. The reset of the syndromes replaces the syndromes with the corresponding syndromes in the originally determined first and second sets of FEC syndromes.

Figure 10:
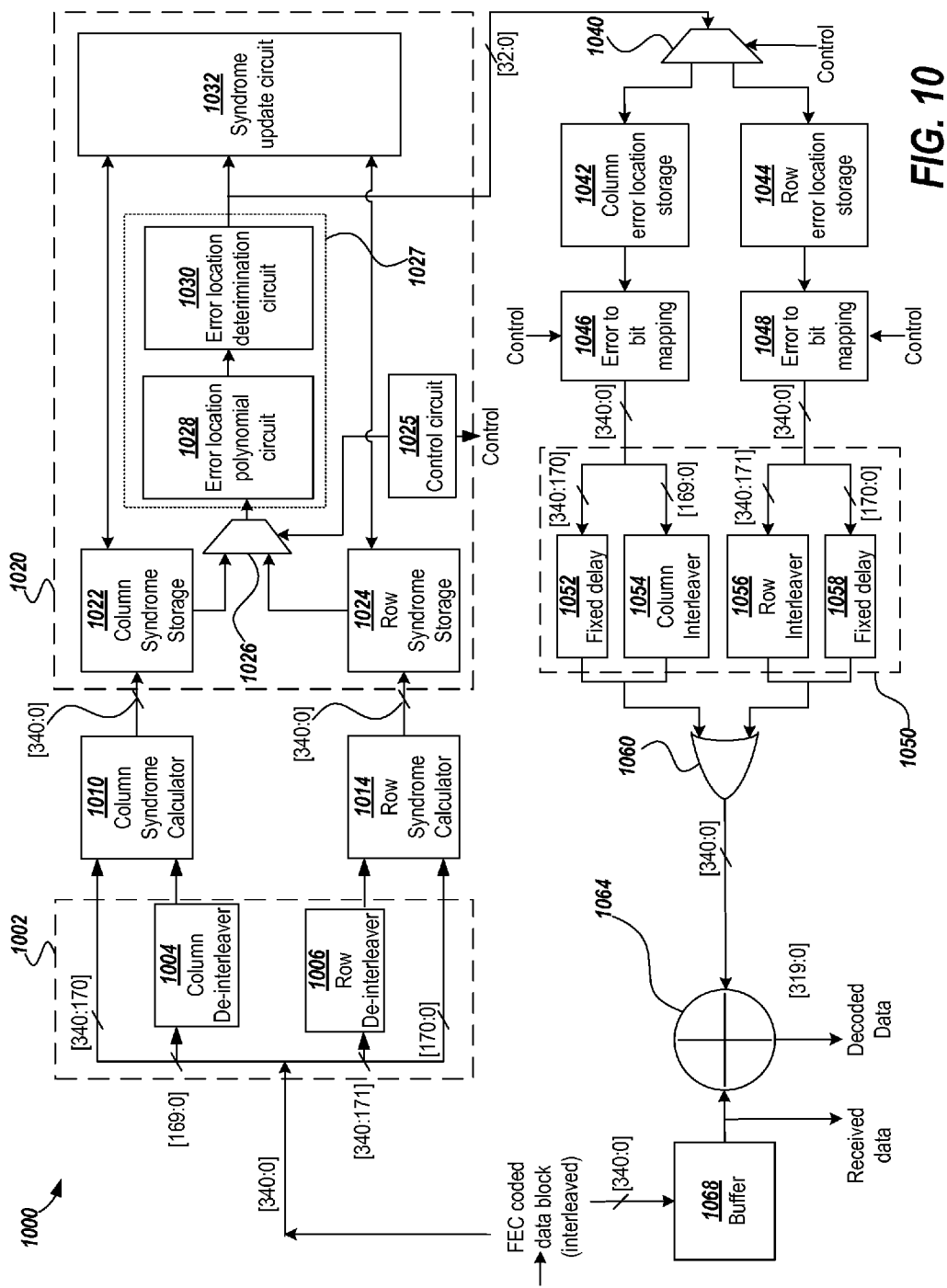
FIG. 10 shows a circuit for windowed FEC decoding.

FIG. 10 shows a circuit for FEC decoding of windows of rows and columns. The circuit 1000 includes a first formatting circuit 1002 configured to receive symbols in the interleaved format having L columns. The first formatting circuit is configured to rearrange a first copy of the symbols from the interleaved format into the row-aligned format and rearrange a second copy of the symbols from the interleaved format into the column-aligned format. In this example, the first formatting circuit 1002 includes a row de-interleaver circuit 1006 configured to delay the leftmost (L−1)/2 columns of the symbols (i.e., bits 340:171) in the interleaved format, as described with reference to FIG. 4, to produce the first copy of the symbols in the row-aligned format. The first formatting circuit 1002 also includes a column de-interleaver circuit 1004 configured to delay the rightmost (L−1)/2 columns of the symbols (i.e., bits 169:0) in the interleaved format to produce the second copy of the symbols in the column-aligned format.

The circuit 1000 includes a column syndrome calculator 1010 coupled to receive the symbols in the column-aligned format from the first formatting circuit 1002. The column syndrome calculator 1010 is configured to calculate syndromes for respective rows of the symbols in the column-aligned format (i.e., columns of the symbols in the de-interleaved format) and store the calculated syndromes in a column syndrome storage memory 1022. Similarly, the circuit 1000 includes a row syndrome calculator 1014 coupled to receive the symbols in the row-aligned format from the first formatting circuit 1002. The row syndrome calculator 1014 is configured to calculate syndromes for respective rows of the symbols in the row-aligned format (i.e., row of the symbols in the de-interleaved format) and store the calculated syndromes in a row syndrome storage memory 1024.

The circuit 1000 includes a windowed decoder circuit 1020 configured to maintain a group of windows and perform FEC decoding on windows in the group as discussed above with reference to FIGS. 8 and 9. The windowed decoder circuit includes the row and column syndrome storage memories (1024 and 1022), which are used to store syndromes corresponding to the rows and columns included in windows to be decoded. A control circuit 1025 is configured to maintain a list of windows included in the group and, in each decoding iteration, select rows and columns of windows in the group for decoding.

The control circuit 1025 causes a selection circuit 1026 to retrieve and provide row syndromes to a decoder circuit 1027 for decoding rows of the windows in the group. After decoding rows of the windows in the group, the control circuit causes the selection circuit 1026 to retrieve and provide column syndromes to a decoder circuit 1027 for decoding columns of the windows in the group.

The decoder circuit 1027 includes an error location polynomial circuit 1028 configured to generate error location polynomials for the retrieved row/column syndromes. An error location determination circuit 1030 is configured to determine locations of symbols in error using the error location polynomials generated by the error location polynomial circuit 1028. The control circuit 1025 causes selection circuit 1040 to store the determined locations of symbols in error of decoded rows and columns in row error location storage 1044 and column error location storage 1042, respectively.

In this example, only one windowed decoder 1020 is illustrated. However, the circuit may be implemented to include multiple windowed decoders 1020 to decode respective ones of the windows in the group in parallel. For instance, in one implementation, the circuit 1000 is configured to maintain a group having four windows. In this implementation, the circuit includes sixteen of the windowed decoders 1020, and four windowed decoders are configured to decode a respective window of the group.

Syndrome update circuit 1032 is configured to update row and column syndromes as described with reference to FIG. 9. In each decoding iteration, if additional errors exist in a row following a decoding of the row, the corresponding row syndrome and column syndromes affected by the row are updated. Conversely, if additional errors exist in a column following decoding of the column, the corresponding column syndrome and row syndromes affected by the column are updated.

When a window is removed from the group, the control circuit 1025 causes error-to-bit mapping circuits 1046 and 1048 to map the stored errors locations to produce respective error matrices in respective column-aligned and row-aligned formats. Each error matrix includes one bit for every bit in the FEC coded data. Each bit of the error matrix has a value of '1' if the corresponding bit in the FEC coded data is in error and, otherwise, has a value of '0'.

The circuit 1000 includes a second formatting circuit 1050 configured to receive and reformat each of the error matrices into the interleaved format. In this example, the second formatting circuit 1050 includes a fixed delay 1052 and a column interleaver circuit 1054 to reformat the error matrix generated by error-to-bit mapping circuit 1046 from the column-aligned format into the interleaved format as described with reference to FIG. 7. Conversely, the second formatting circuit includes row interleaver 1056 and fixed delay 1058 to reformat the error matrix generated by error-to-bit mapping circuit 1048 from the row-aligned format into the interleaved format.

A logical 'OR' circuit 1060 is coupled to receive and combine the error matrices in the interleaved format to produce a combined error matrix. A correction circuit 1064 is configured to correct errors in the original FEC coded data block, which is buffered in memory buffer 1068, by XORing the data block with the combined error matrix.

In some implementations of the described methods and systems for FEC coding and decoding, an FEC encoder is configured to adjust the coding rate of the FEC code. For instance, in one implementation, the encoder is configured to utilize the braided BCH (1023, 991) code with the coding rate reduced to match that of the OTU frame, which has a lower coding rate. As such, the need for additional rate matching circuitry is mitigated. This saves a significant amount of resources and reduces latency at both the encoder and subsequent decoder. In one particular implementation, the payload of each of the braided BCH codewords is reduced to 1020 bits. As a result, the code rate of the braided BCH code becomes (1020−32−32)/1020 (~0.9372549), which is equal to that of the OTU frame. For ease of reference, the braided BCH coding with reduced payload may be referred to as the reduced braided coding.

The reduced braided coding may be implemented by reserving the center 3-bit symbol of each vertical and horizontal segment pair in the de-interleaved format with zero padding bits (e.g., zero bits) rather than payload. As a result, the payload of each codeword is reduced from 1023 bits to 1020 bits as needed to implement the reduced braided coding.

Figure 11:
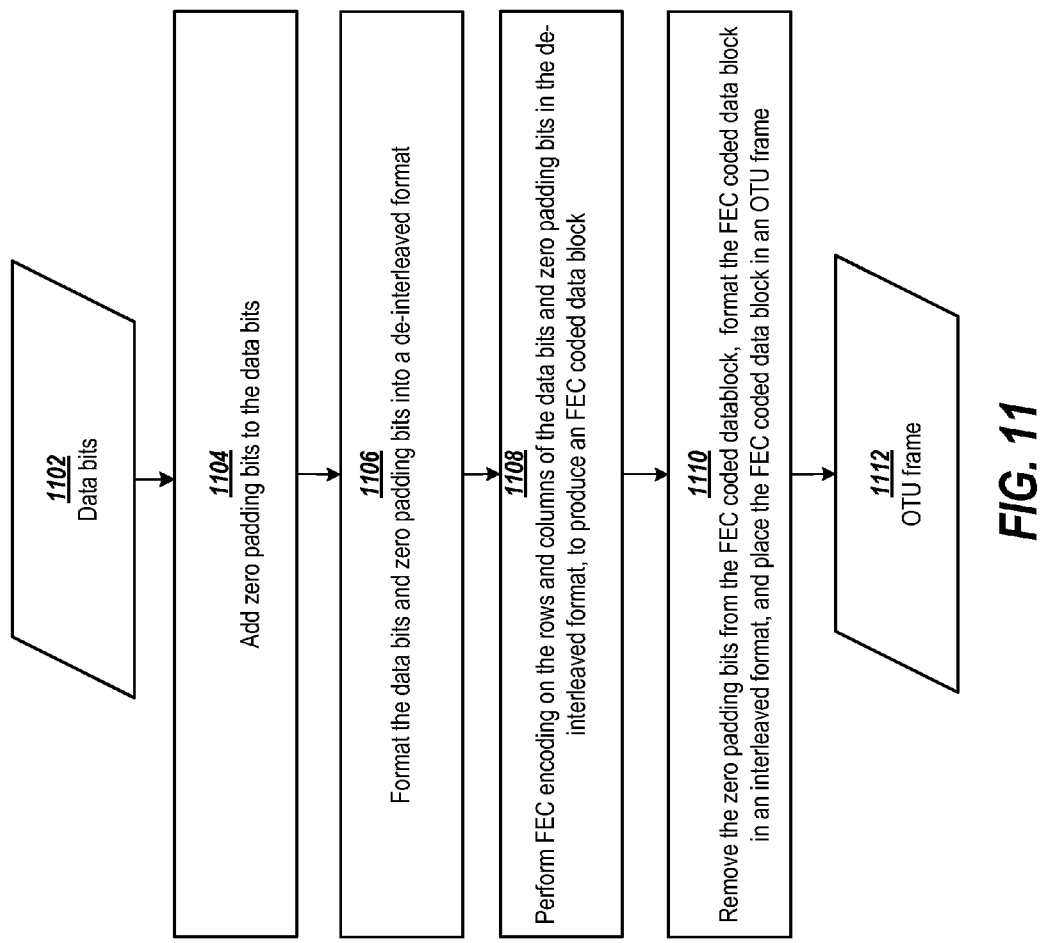
FIG. 11 shows a method for producing FEC coded data having a first code rate using a FEC block coding method having a second coding rate that is higher than the first coding rate.

For ease of reference, the examples of reducing the coding rate of FEC codes are primarily described with reference to the braided BCH coding having each codeword coded using BCH (1023, 991) code. However, the disclosed methods and systems may be adapted to utilize and adjust the coding rate of other FEC codes as well. FIG. 11 shows a method for producing FEC coded data having a first FEC coding rate using an FEC block coding method having a second FEC coding rate that is higher than the first FEC coding rate. Zero padding bits are added to a set of received data bits 1102 at block 1104. The data bits and the zero padding bits are rearranged into a braided FEC format at block 1106. FEC encoding is performed on respective rows and columns of the data bits and zero padding bits in the braided FEC format at block 1108 to produce a braided FEC coded data block. After FEC coding, the zero padding bits from the braided FEC coded data block are removed at block 1110, and symbols of the FEC coded data block are rearranged into the interleaved format. The FEC coded data block may then be transported in an OTU frame 1112.

Figure 12:
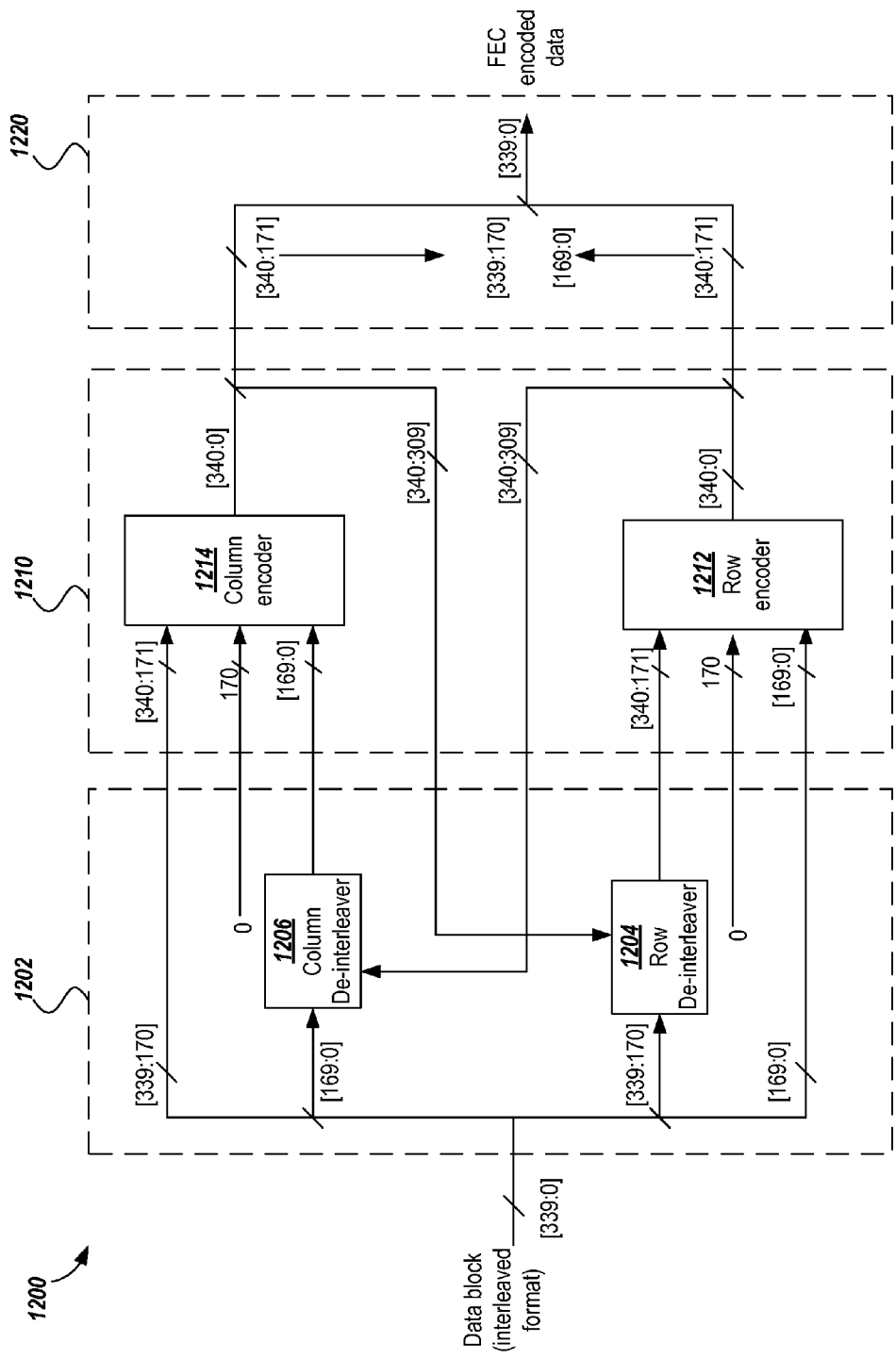
FIG. 12 shows a circuit for FEC encoding consistent with the method shown in FIG. 10.

FIG. 12 shows an encoding circuit for FEC braided BCH encoding. In this example, the encoding circuit is configured to receive data symbols in a rectangular matrix format. The data symbols in the rectangular matrix format are arranged as the data symbols in the interleaved format. In this example, the encoding circuit is configured to receive 3-bit data symbols arranged in 340 columns. The encoder circuit 1200 is configured to receive one row of the symbols in the interleaved format over a 339:0 bit data channel (1-bit for each of the 340 columns) every three data input cycles.

The encoder 1200 includes a first formatting stage 1202 configured to arrange the received data symbols into each of the row-aligned and column-aligned formats with zero padding bits added in the center symbols (170). As described above, the addition of the zero padding bits allows rows and columns of the data symbols to be encoded with BCH (1023, 991) encoding with the coding rate being reduced to match that used by OTU frames.

In this example, the first formatting stage 1202 includes a row de-interleaver circuit 1204 configured to shift the left half of the received bits ([339:170]) to arrange the symbols in these columns into the row-aligned format. The shifted bits ([339:170]) are combined with the zero padding bits and received bits ([169:0]) to place the received data symbols in the row-aligned format. The first formatting stage 1202 also includes a column de-interleaver circuit 1206 configured to shift the right half of the received bits ([169:0]) to arrange the symbols in these columns into the column-aligned format. The shifted bits ([169:0]) are combined with the zero padding bits and received bits ([339:170]) to place the received data symbols into the column-aligned format.

The encoding circuit 1200 includes an encoding stage 1210 configured to perform BCH encoding of rows of the row-aligned format and BCH encoding of columns of the column-aligned format in parallel. The encoding stage 1210 includes a row encoding circuit 1212 configured to encode rows of the row-aligned format (i.e., rows of the de-interleaved format) with BCH (1023, 991) coding. The encoding stage 1210 also includes a column encoding circuit 1214 configured to encode rows of the column-aligned format (i.e., columns of the de-interleaved format) with BCH (1023, 991) coding. The encoding stage is configured to feedback the generated parity bits from the row encoder circuit 1212 to the column de-interleaver 1206 for the generated parity bits to be incorporated into column encoding of subsequent columns of the de-interleaved format. The encoding stage is also configured to feedback the generated parity bits from the column encoder circuit 1214 to the row de-interleaver 1204 for the generated parity bits to be incorporated into row encoding of subsequent rows of the de-interleaved format.

The encoder 1200 includes a second formatting stage 1220 configured to merge the parity bits and data symbols output from the row encoder circuit 1212 and the column encoder circuit 1214 to produce a braided FEC coded data block in the interleaved format. The second formatting stage 1220 is configured to remove the zero padding bits from the braided FEC coded data block to reduce the block size back to 340 bits and produce data coded with the reduced braided coding. As a result, the coding rate is (1020−32−32)/1020 (~0.9372549), which is equal to that of the OTU frame.

FEC can be performed on reduced braided coding with slight modification to the decoding methods and circuits described above. For instance, in one implementation, a decoder is configured to reformat reduced braided coded symbols to add zero padding bits to the center bit in each row of the received symbols in the interleaved format. Row and column FEC decoding is then performed as described with reference to FIGS. 8-10. After FEC decoding, the zero padding bits are removed from the corrected data.

Figure 13:
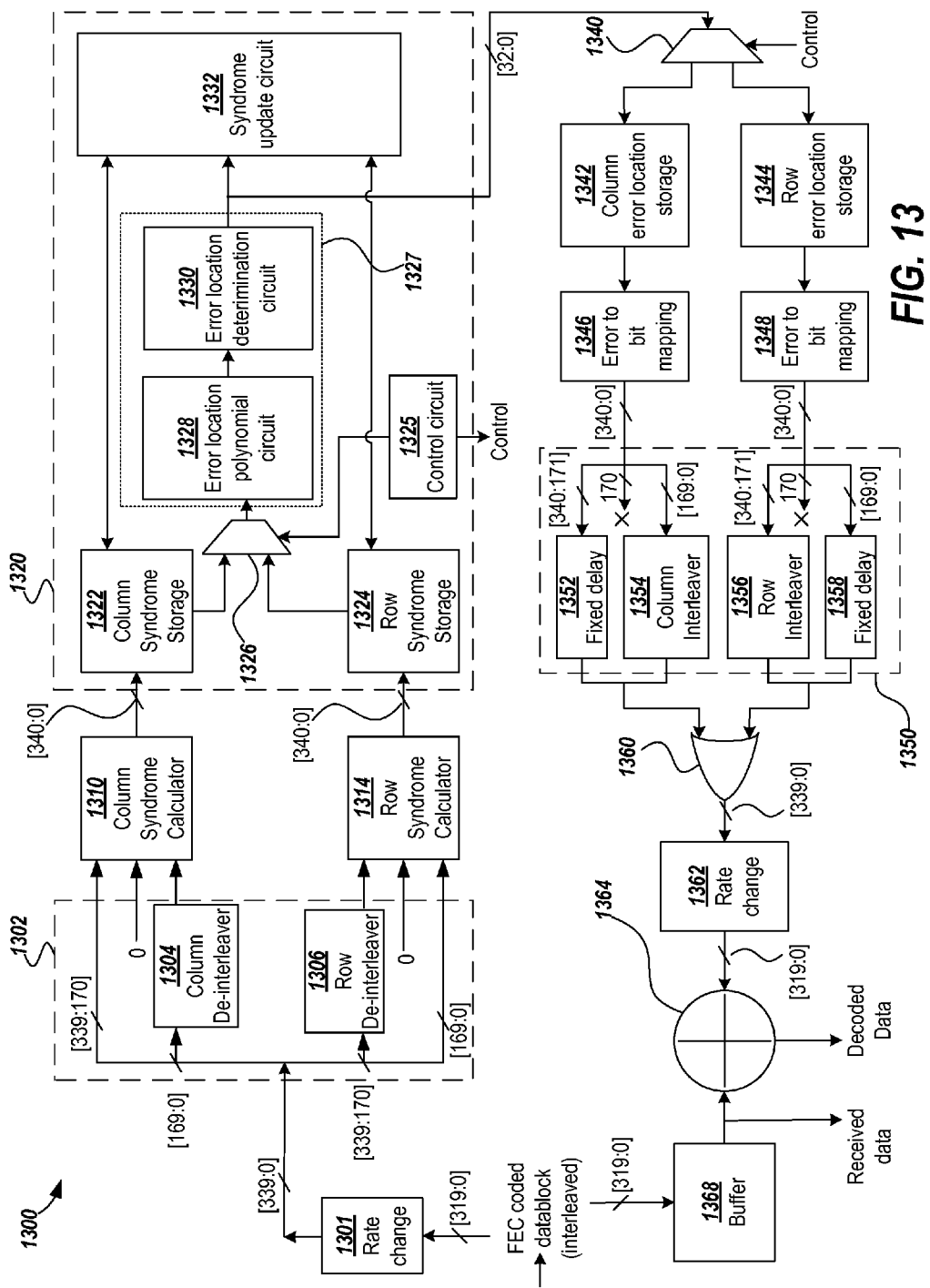
FIG. 13 shows the decoding circuit example in FIG. 9 configured to insert zero padding bits.

For instance, FIG. 13 shows the decoding circuit example in FIG. 10 configured to insert zero padding bits into received data blocks coded with the reduced braided coding. In this example, decoding of the adjusted data block is primarily implemented in the same manner as that described with reference to FIG. 10. The circuit 1300 includes a rate change circuit 1301 configured to adjust the coding rate of the received data block. First and second formatting circuits 1302 and 1350 are similar to the first and second formatting circuits 1002 and 1050 described with reference to FIG. 10, but are slightly modified to add and remove zero padding bits.

In this example, the first formatting circuit 1302 includes a row de-interleaver circuit 1306 configured to delay the leftmost ([339:170]) bits in the interleaved format to produce the first copy of the symbols in the row-aligned format. The first formatting circuit 1302 also includes a column de-interleaver circuit 1304 configured to delay the rightmost ([169:0]) bits in the interleaved format to produce the second copy of the symbols in the column-aligned format.

Received bits ([169:0]) are provided to inputs ([169:0]) of the row syndrome calculator 1314. A zero padding bit is provided to input (170) of the row syndrome calculator 1314. Outputs of the row de-interleaver 1306 are provided to inputs ([340:171]) of the row syndrome calculator 1314.

Similarly, received bits ([339:170]) are provided to inputs ([340:171]) of the column syndrome calculator 1310. A zero padding bit is provided to input (170) of the column syndrome calculator 1310. Outputs of the column de-interleaver 1304 are provided to inputs ([169:0]) of the column syndrome calculator 1310.

Column and row syndrome calculators 1310 and 1314 operate in a similar manner as that described with reference to column and row syndrome calculators 1010 and 1014 in FIG. 10. Similarly, decoder circuit 1320 and components 1322, 1324, 1326, 1327, 1328, 1330 and 1332 a similar manner as decoder circuit 1020 and components 1022, 1024, 1026, 1027, 1028, 1030 and 1032.

Likewise, selection circuit 1340, column and row error location storage 1342 and 1344, and error-to-bit mapping circuits 1346 and 1348 operate in a similar manner as selection circuit 1040, column and row error location storage 1042 and 1044, and error-to-bit mapping circuits 1046 and 1048 in FIG. 10.

The second formatting circuit 1350 is configured to reformat each of the error matrices into the interleaved format as described with reference to formatting circuit 1050 in FIG. 10. However, in this example, the second formatting circuit 1350 is configured to remove the zero padding bits added by the first formatting circuit 1302.

The second formatting circuit 1350 includes a fixed delay 1352 and a column interleaver circuit 1354 to reformat the error matrix generated by error-to-bit mapping circuit 1346 from the column-aligned format into the interleaved format as described with reference circuits 1052 and 1054 in FIG. 10. In this example, the fixed delay circuit 1352 processes bits ([340:171]) of the error matrix generated by the error-to-bit mapping circuit 1346. The column interleaver 1354 processes bits ([169:0]) of the error matrix generated by the error-to-bit mapping circuit 1346. Output of the fixed delay circuit 1352 is shifted to bits 339:170 in the interleaved format of the error matrix.

The second formatting circuit 1350 also includes a fixed delay 1358 and a row interleaver circuit 1356 to reformat the error matrix generated by error-to-bit mapping circuit 1348 from the row-aligned format into the interleaved format as described with reference circuits 1056 and 1058 in FIG. 10. In this example, the fixed delay circuit 1358 processes bits ([169:0]) of the error matrix generated by the error-to-bit mapping circuit 1348. The row interleaver 1356 processes bits ([340:171]) of the error matrix generated by the error-to-bit mapping circuit 1348. Output of the row interleaver 1356 is shifted to bits 339:170 in the interleaved format of the error matrix.

As described with reference to 1060 in FIG. 10, a logical 'OR' circuit 1360 is coupled to receive and combine the error matrices in the interleaved format from the second formatting circuit 1350 to produce a combined error matrix. A second rate change circuit 1362 is configured to adjust the combined error matrix to match the coding rate of the original FEC coded data block input to the circuit 1300. A correction circuit 1364 is configured to correct errors in the original FEC coded data block, which is buffered in memory buffer 1368, by XORing the data block with the combined error matrix output from the rate change circuit 1362.

Figure 14:
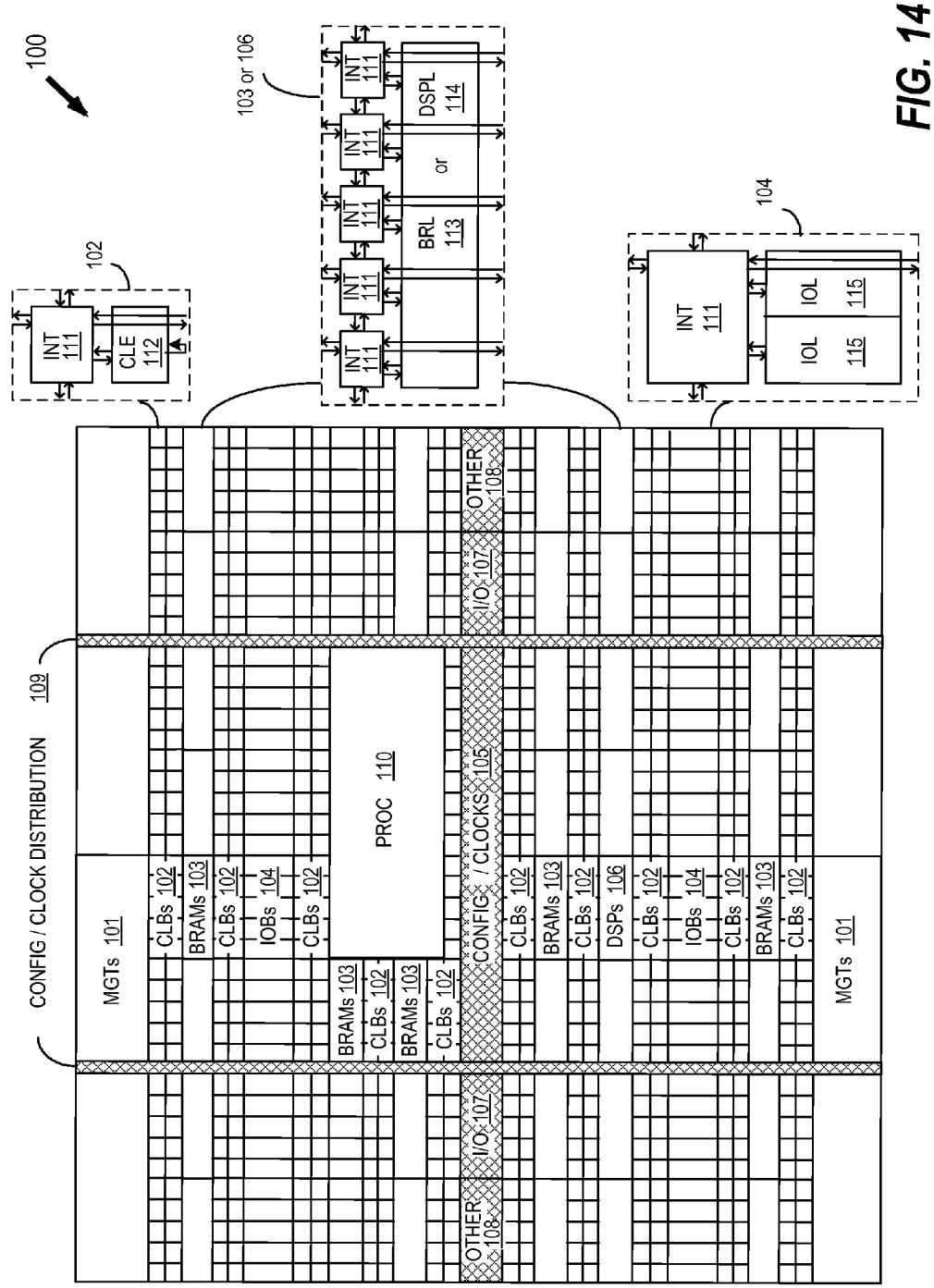
FIG. 14 shows a programmable IC that may be configured to implement the disclosed circuits.

FIG. 14 is a block diagram of an example programmable logic integrated circuit that may be used in implementing an FEC decoder in accordance with various disclosed embodiments. An FEC decoder, as previously described, may be implemented on the programmable logic and interconnect resources of a programmable integrated circuit.

FPGAs can include several different types of programmable logic blocks in the array. For example, FIG. 14 illustrates an FPGA architecture (100) that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107), for example, e.g., clock ports, and other programmable logic 108 such as digital clock managers, analog-to-digital converters, system monitoring logic, and so forth. Some FPGAs also include dedicated processor blocks (PROC 110) and internal and external reconfiguration ports (not shown).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element INT 111 also includes the connections to and from the programmable logic element within the same tile, as shown by the examples included at the top of FIG. 14.

For example, a CLB 102 can include a configurable logic element CLE 112 that can be programmed to implement user logic plus a single programmable interconnect element INT 111. A BRAM 103 can include a BRAM logic element (BRL 113) in addition to one or more programmable interconnect elements. Typically, the number of interconnect elements included in a tile depends on the height of the tile. In the pictured FPGA, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element INT 111. As will be clear to those of skill in the art, the actual I/O pads connected, for example, to the I/O logic element 115 are manufactured using metal layered above the various illustrated logic blocks, and typically are not confined to the area of the input/output logic element 115.

In the pictured FPGA, a columnar area near the center of the die (shown shaded in FIG. 14) is used for configuration, clock, and other control logic. Horizontal areas 109 extending from this column are used to distribute the clocks and configuration signals across the breadth of the FPGA.

Some FPGAs utilizing the architecture illustrated in FIG. 14 include additional logic blocks that disrupt the regular columnar structure making up a large part of the FPGA. The additional logic blocks can be programmable blocks and/or dedicated logic. For example, the processor block PROC 110 shown in FIG. 14 spans several columns of CLBs and BRAMs.

Note that FIG. 14 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear, to facilitate the efficient implementation of user logic.

The disclosed embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A circuit for forward error correction decoding, comprising:
    a first syndrome calculation circuit, configured to calculate a first set of FEC syndromes for groups of symbols that are equal to respective rows of symbols in a de-interleaved format;
    a second syndrome calculation circuit, configured to calculate a second set of FEC syndromes for groups of symbols that are equal to respective columns of the symbols in the de-interleaved format;
    a decoding circuit configured to:
        arrange the symbols into windows, each window including a plurality of sequential rows and a plurality of sequential columns of the symbols in the de-interleaved format;
        place N of the windows in a group; and
        perform M decoding iterations of the windows in the group, in each decoding iteration the decoding circuit is configured to:
            perform FEC decoding of rows of each of the windows in the group using the first set of FEC syndromes; and
            after the FEC decoding of rows of each of the windows in the group, perform FEC decoding of columns of each of the windows in the group using the second set of FEC syndromes.

2. The circuit of claim 1, further comprising:
    a formatting circuit coupled to the first and second syndrome calculation circuits and configured to:
        arrange a set of symbols from an interleaved format into a row-aligned format, wherein each row of the set of symbols in the row-aligned format includes data symbols in a respective one of the groups of symbols equal to respective rows of the symbols in the de-interleaved format; and
        arrange the set of symbols from the interleaved format into a column-aligned format, wherein each row of the set of symbols in the column-aligned format includes symbols in a respective one of the groups of the symbols equal to respective columns of the symbols in the de-interleaved format.

3. The circuit of claim 1, wherein the decoding circuit is further configured to, after the M decoding iterations of the windows in the group and in response to receiving an additional window:
    remove one of the windows from an end of the group;
    add the additional window to a front of the group; and
    perform the M decoding iterations of the windows in the group.

4. The circuit of claim 1, wherein the decoding circuit includes a syndrome update circuit configured to, in each decoding iteration:
    in response to completing the FEC decoding of rows of each of the windows in the group and errors remaining in one of the rows:
        update a syndrome in the first set of FEC syndromes corresponding to the row including the errors; and
        update syndromes in the second set of FEC syndromes; and
    in response to completing the FEC decoding of columns of each of windows in the group and errors remaining in one of the columns:
        update a syndrome in the second set of FEC syndromes corresponding to the column including the errors; and
        update syndromes in the first set of FEC syndromes.

5. The circuit of claim 1, wherein the decoding circuit includes a plurality of FEC decoding circuits that are configured to, in each of the M decoding iterations, perform FEC decoding on the windows in the group in parallel.

6. The circuit of claim 1, wherein the decoding circuit includes:
    a first memory circuit configured to store locations of the rows determined to be in error; and
    a second memory circuit configured to store locations of the columns determined to be in error.

7. The circuit of claim 6, further comprising a correction circuit coupled to the first and second memories and configured to:
    in response to a window being removed from the group of windows, correcting symbols of the window determined to be in error using the locations of rows and columns determined to be in error that are stored in the first and second memories.

8. The circuit of claim 7, wherein the correction circuit includes:
    a first error-to-bit mapping circuit configured to, in response to a window being removed from the group of windows, generate a first error matrix of the window in the row-aligned format using the locations of rows determined to be in error that are stored in the first memory; and
    a second error-to-bit mapping circuit configured to, in response to the window being removed from the group of windows, generate a second error matrix of the window in the column-aligned format using the locations of rows determined to be in error that are stored in the first memory.

9. The circuit of claim 8, wherein the correction circuit further includes:
  a formatting circuit coupled to the first and second error-to-bit mapping circuits and configured to reformat the first and second error matrices into the interleaved format;
  a combining circuit coupled to the formatting circuit and configured to combine the first and second error matrices to produce a combined error matrix in the interleaved format; and
  a XOR circuit configured to correct bits in each window using a combined error matrix corresponding to the window.

10. A method for forward error correction (FEC) decoding, comprising:
  receiving a first plurality of symbols in an interleaved format;
  determining, by a first syndrome calculation circuit, a first set of FEC syndromes for respective groups of the data symbols corresponding to respective rows of the symbols in a de-interleaved format;
  determining, by a second syndrome calculation circuit, a second set of FEC syndromes for respective groups of the data symbols corresponding to respective columns of the symbols in the de-interleaved format;
  using the first and second sets of FEC syndromes, performing FEC decoding of windows of the symbols by a decoding circuit, each window including a plurality of sequential rows of the symbols in the de-interleaved format and a plurality of sequential columns of the symbols in the de-interleaved format, the FEC decoding of the windows of the symbols including:
  placing N of the windows in a group; and
  performing M decoding iterations of the windows in the group, each decoding iteration including:
    performing FEC decoding of rows of each window in the group; and
    after the FEC decoding of rows of each window in the group, performing FEC decoding of columns of each window in the group.

11. The method of claim 10, wherein the FEC decoding of the windows of the symbols further includes, after the M decoding iterations of the windows in the group, in response to receiving an additional window:
  removing one of the windows from an end of the group;
  adding the additional window to the front of the group; and
  performing the M decoding iterations of the windows in the group.

12. The method of claim 10, wherein the M decoding iterations of the windows in the group further includes:
  in response to completing the FEC decoding of rows of each of the windows in the group and errors remaining in one of the rows:
    updating a syndrome in the first set of FEC syndromes corresponding to the row including the errors; and
    updating syndromes in the second set of FEC syndromes; and
  in response to completing the FEC decoding of columns of each of the windows in the group and errors remaining in one of the columns:
    updating a syndrome in the second set of FEC syndromes corresponding to the column including the errors; and
    updating syndromes in the first set of FEC syndromes.

13. The method of claim 12, further comprising:
after performing one or more decoding iterations of a window in the group, resetting one or more of the updated syndromes in the first and second set of FEC syndromes, corresponding to rows and columns of the window, to the syndromes of the determined first and second sets of EC syndromes.

14. The method of claim 10, wherein for each of the M decoding iterations of the windows in the group, FEC decoding is performed on the windows in the group in parallel.

15. The method of claim 10, wherein:
  the performing FEC decoding of rows of each of the windows in the group includes storing locations of the rows determined to be in error in a first memory; and
  the performing FEC decoding of columns of each of the windows in the group includes storing locations of the columns determined to be in error in a second memory.

16. The method of claim 15, further comprising:
  in response to removing a window from the group of windows, correcting symbols of the window determined to be in error using the locations of rows and columns determined to be in error that are stored in the first and second memories.

17. The method of claim 10, wherein the determining of the first and second sets of FEC syndromes includes:
  formatting the symbols from the interleaved format into a row-aligned format, wherein each row of the symbols in the row-aligned format includes symbols equal to symbols in a corresponding row in the de-interleaved format; and
  formatting the symbols from the interleaved format into a column-aligned format, wherein each row of the symbols in the column-aligned format includes symbols equal to symbols in a corresponding row in the de-interleaved format.

18. The method of claim 10, wherein:
  the determining the first set of FEC syndromes for respective groups of the symbols corresponding to respective rows of the symbols in the de-interleaved format includes:
    formatting the symbols from the interleaved format into a row-aligned format, wherein each row of the symbols in the row-aligned format includes symbols equal to symbols in a corresponding row in the de-interleaved format; and
    determining FEC syndromes for respective rows of the symbols in the row-aligned format; and
  the determining the second set of FEC syndromes for respective groups of the symbols corresponding to respective columns of the symbols in the de-interleaved format includes:
    formatting the symbols from the interleaved format into a column-aligned format, wherein each row of the symbols in the column-aligned format includes symbols equal to symbols in a corresponding row in the de-interleaved format; and
    determining FEC syndromes for respective rows of the symbols in the column-aligned format.

19. A method for forward error correction (FEC) encoding, comprising:
  receiving a data block of symbols in an interleaved format;
  adjusting a rate of the data block of symbols;
  adding a plurality of symbols including zero padding bits to the data block of symbols in the interleaved format;
  determining, by a first syndrome calculation circuit, a first set of FEC syndromes for respective groups of the symbols in the data block corresponding to respective rows of the symbols in a de-interleaved format;
  determining, by a second syndrome calculation circuit, a second set of FEC syndromes for respective groups of the symbols of the data block corresponding to respective columns of the symbols in the de-interleaved format;

using the first and second sets of FEC syndromes, performing FEC decoding of windows of the symbols by a decoding circuit, each window including a plurality of sequential rows of the symbols in the de-interleaved format and a plurality of sequential columns of the symbols in the de-interleaved format, the FEC decoding of the windows of the symbols including:

placing N of the windows in a group; and performing M decoding iterations of the windows in the group, each decoding iteration including:
- performing FEC decoding of rows of each window in the group; and
- after the FEC decoding of rows of each window in the group, performing FEC decoding of columns of each window in the group.

20. The method of claim 19, wherein:

the FEC decoding of the windows of the symbols further includes, after the M decoding iterations of the windows in the group, in response to receiving an additional window:

removing one of the windows from an end of the group;

adding the additional window to a front of the group; and performing the M decoding iterations of the windows in the group; and the FEC decoding of rows and columns of each of the windows in the group includes:

storing locations of the rows and columns determined to be in error in a memory; and in response to removing a window from the group of windows:

generating an error matrix for the window determined to be in error using the locations of rows and columns in error that are stored in the memory;

removing bits of the error matrix corresponding to the zero-padding bits to produce a modified error matrix;

adjusting the rate of the error matrix to match the rate at which the data block of symbols is received; and correcting bits in error of the received data block of symbols using the error matrix.

* * * * *